(12) United States Patent
Jayakumar

(10) Patent No.: US 12,033,903 B1
(45) Date of Patent: Jul. 9, 2024

(54) HIGH-DENSITY MICROBUMP AND PROBE PAD ARRANGEMENT FOR SEMICONDUCTOR COMPONENTS

(71) Applicant: Amazon Technologies, Inc., Seattle, WA (US)

(72) Inventor: Nikhil Jayakumar, San Jose, CA (US)

(73) Assignee: Amazon Technologies, Inc., Seattle, WA (US)

( * ) Notice: Subject to any disclaimer, the term of this patent is extended or adjusted under 35 U.S.C. 154(b) by 112 days.

(21) Appl. No.: 17/546,359

(22) Filed: Dec. 9, 2021

(51) Int. Cl.
| | |
|---|---|
| *H01L 23/50* | (2006.01) |
| *H01L 21/66* | (2006.01) |
| *H01L 23/00* | (2006.01) |
| *H01L 23/498* | (2006.01) |

(52) U.S. Cl.
CPC ........ *H01L 22/34* (2013.01); *H01L 23/49811* (2013.01); *H01L 23/50* (2013.01); *H01L 24/14* (2013.01); *H01L 2224/1412* (2013.01)

(58) Field of Classification Search
CPC ... H01L 22/34; H01L 23/49811; H01L 24/14; H01L 23/50
See application file for complete search history.

(56) References Cited

U.S. PATENT DOCUMENTS

| | | | | |
|---|---|---|---|---|
| 2002/0113307 | A1* | 8/2002 | Jamieson | H05K 1/112 |
| | | | | 257/E23.07 |
| 2004/0004296 | A1* | 1/2004 | Cheng | H01L 23/552 |
| | | | | 257/E23.079 |
| 2013/0106459 | A1* | 5/2013 | Tseng | G01R 31/2853 |
| | | | | 174/262 |
| 2013/0258792 | A1* | 10/2013 | Kitano | G11C 5/06 |
| | | | | 257/296 |
| 2015/0070863 | A1* | 3/2015 | Yun | H05K 1/032 |
| | | | | 361/767 |

FOREIGN PATENT DOCUMENTS

JP      2003338519 A   * 11/2003        H01L 23/49838

* cited by examiner

*Primary Examiner* — Michele Fan
(74) *Attorney, Agent, or Firm* — Kilpatrick Townsend & Stockton LLP

(57) ABSTRACT

A semiconductor package component (such as a die or interposer) can include a body having a top surface and a bottom surface. The component can further include an interface array arranged along the top surface or the bottom surface. The interface array can include a first set of microbumps arranged in a first row. The interface array can further include a second set of microbumps arranged in a second row adjacent the first row. The interface array can also include a probe pad extending into both the first row and the second row.

16 Claims, 4 Drawing Sheets

US 12,033,903 B1

HIGH-DENSITY MICROBUMP AND PROBE PAD ARRANGEMENT FOR SEMICONDUCTOR COMPONENTS

BACKGROUND

In semiconductor manufacturing, a package may correspond to a suitable container and/or assembly for holding a semiconductor die. The package may protect the die, dissipate heat, connect the die to other dice or components, and/or perform other important functions.

Designs of packages may often be constrained by sizing and/or spacing considerations. Sizing of components and/or spacing among components accordingly can be important factors in fabrication of semiconductor packages.

BRIEF DESCRIPTION OF THE DRAWINGS

Various embodiments in accordance with the present disclosure will be described with reference to the drawings, in which.

DETAILED DESCRIPTION

Various examples described herein are directed to systems or techniques relating to semiconductor packages. The semiconductor packages can include substrates, interposers, and a die or multiple dice. A die may be mounted on an interposer, which may be in turn mounted on a substrate, for example. Suitable interface arrays may be included to facilitate communication and/or other electrical connection with and/or among various of the components. For example, a die may include an array with an arrangement or pattern of microbumps and probe-pads. The micro-bumps may be relatively smaller connectivity interfaces that may be suitable for establishing connection between the die and the interposer, while the probe-pads may correspond to relatively larger connectivity interfaces suitable for use during testing procedures to verify basic functionality of the die before connection with the interposer and/or when otherwise independent from the interposer. Generally, the connectivity interfaces may be arranged so that the microbumps define adjacent pairs of rows, and the probe-pads may be arranged to extend into both rows in a pair (e.g., such as into a space where at least one microbump has been eliminated in each row). Compared to a contrary arrangement that instead relies on sizing an individual row to be large enough to fit a probe-pad completely within that single row, utilizing arrangements herein in which the probe-pad extends into two adjacent rows of microbumps may allow the microbumps to be more closely clustered while still satisfying minimum distance rules (e.g., rules for fabrication of a semiconductor device) and may thus achieve greater density of connectivity interfaces within a given space constraint.

In the following description, various embodiments will be described. For purposes of explanation, specific configurations and details are set forth in order to provide a thorough understanding of the embodiments. However, it will also be apparent to one skilled in the art that the embodiments may be practiced without the specific details. Furthermore, well-known features may be omitted or simplified in order not to obscure the embodiment being described.

Figure 1:
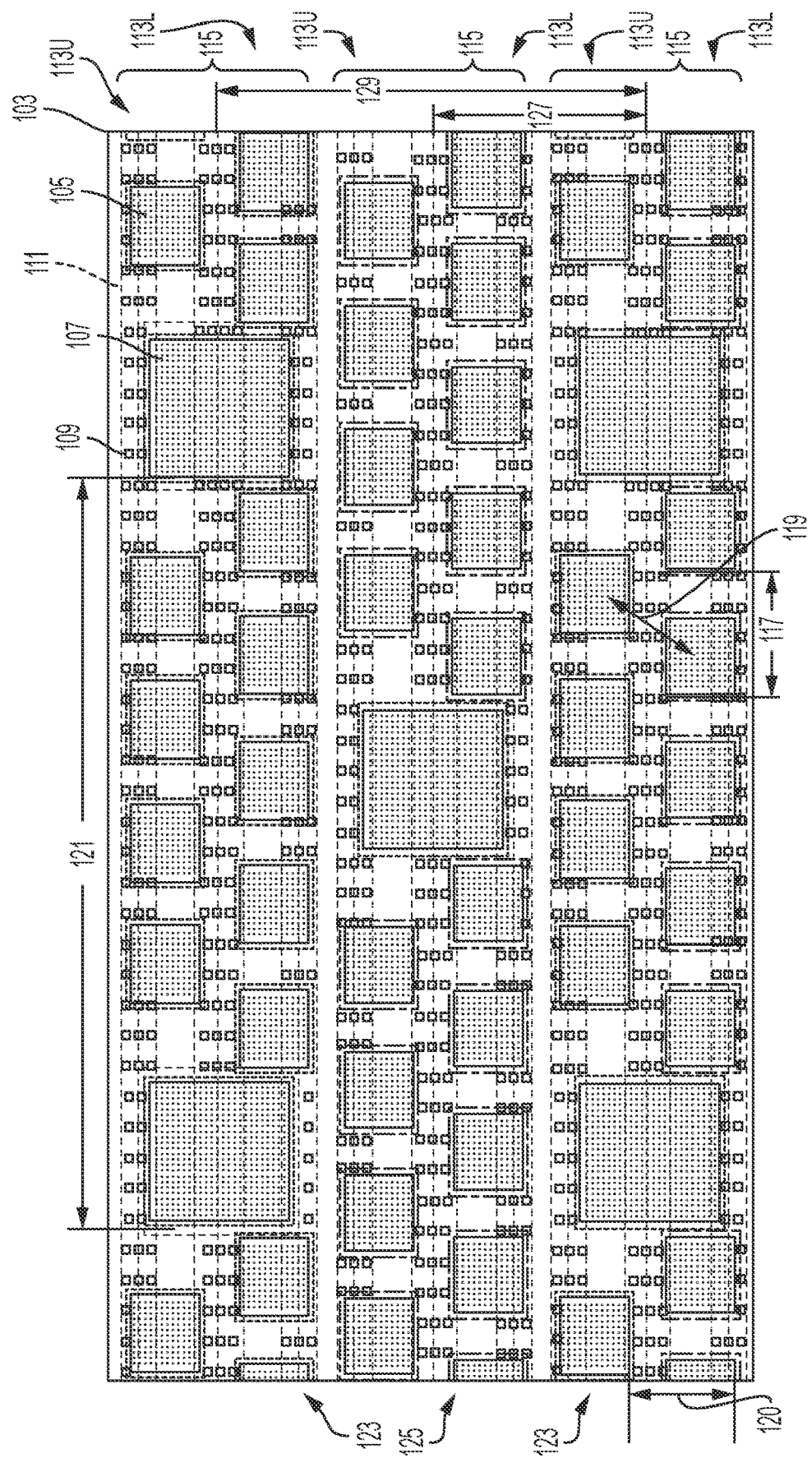
FIG. 1 illustrates an example of an array of microbumps and probe pads in accordance with various embodiments.

FIG. 1 illustrates an example of a system 101. The system 101 is depicted with a body 103, microbumps 105, probe pads 107, vias 109, and traces 111, although other combinations of fewer, more, or different elements may be utilized.

The body 103 can correspond to suitable structure for receiving other components. The body 103 may be a portion of a chip on wafer on substrate (CoWoS) or other portion of a semiconductor component and/or package. The body 103 may correspond to a portion of a die 359, an interposer 357, a substrate 355, and/or circuit board 353 as described with respect to FIG. 3 below, or may correspond to any other suitable component. Referring again to FIG. 1, the body 103 can include silicon, fiberglass, or other suitable organic or non-organic materials.

The microbumps 105 and probe pads 107 can correspond to suitable structure for communicating signal and/or power. The microbumps 105 and the probe pads 107 can correspond to pins or other suitable contacts that can be brought into engagement with other structures for communication, for example. The microbumps 105 and the probe pads 107 may be arranged to form an interface array in use.

The probe pads 107 can be larger than the microbumps 105 in height, width, diameter, or other relevant dimension. As an illustrative example, the microbumps 105 (sometimes alternatively referred to as µbumps) may be approximately 25 µm in size (such as 25 µm in diameter or 25 µm×25 µm in height and width). In comparison, the probe pad 107 may be approximately 90 µm in size (such as 25 µm in diameter or 25 µm×25 µm in height and width). However, the microbumps 105 and probe pads 107 are not limited to such sizes. In addition, although the microbumps 105 and probe pads 107 are each depicted generally as square shapes in FIG. 1, other form factors may be used, such as circular shapes, oval shapes, other rounded shapes, other regular polygonal shapes, and/or shapes that are non-uniform in size (e.g., with height differing from width or having some other non-regular polygonal shape).

In operation, probe pads 107 may allow testing devices to be connected which may not be capable of connecting directly to the microbumps 105 due to the smaller size of the microbumps 105. The probe pads 107 may allow a die or other elements that includes the body 103 to be tested prior to incorporation into a semiconductor package, for example. The microbumps 105 may be included in greater number than the probe pads 107. Generally, as a number of microbumps 105 or other connections increases, an amount of current that can be carried can also increase, which may correlate to an increase in an amount of computation that can be achieved by the semiconductor package in use. Accordingly, achieving high density of microbumps 105 (e.g., while also including suitable numbers of probe pads 107) can be desirable for enhanced functionality in operation.

The vias 109 can correspond to metal pieces that connect respective layers. For example, the vias 109 may connect to a redistribution layer (RDL) to connect the microbumps 105 and/or the probe pads 107 to other layers within the body 103. In size (e.g., in diameter or in height and/or width), the vias 109 may be 1.8 µm, 2.7 µm, or other suitable size. The vias 109 may be subject to rules set by foundries or other fabrication sources. For example, rules may prohibit vias from being placed below microbumps 105 and/or probe pads 107 (e.g., to facilitate structural stability of the body 103). In some arrangements, at least two vias are provided at peripheries of microbumps 105 and/or probe pads 107 for redundancy. Including the vias 109 in sufficient quantity may enable suitable current to be carried to and/or from the microbumps 105 and/or the probe pads 107. In various embodiments, the spacing of the microbumps 105 and/or the probe pads 107 may be at least partially dependent on the arrangement of vias 109 included.

The traces 111 may correspond to suitable pathways between other elements. The traces 111 may be suitably arranged for connecting vias 109, probe pads 107, and/or microbumps 105 relative to one another and/or other structures within layers of the body 103. The traces 111 may be formed of copper or other material, for example. Although various routings of the traces 111 are depicted in FIG. 1 by way of example, other combinations of fewer, more, or different routings may be utilized.

The elements of the system 101 can be arranged in suitable relationships to one another. Although various examples of types of spacing and amounts of spacing are discussed herein, it is to be understood that the particular amounts are illustrative only, and other values may be utilized, such as in accordance with specific parameters of particular implementations.

In FIG. 1, the microbumps 105 are respectively arranged in rows 113 (e.g., individually identified as 113U and 113L, for example). The rows 113 may be sized to accommodate a microbump 105, such as having a height that is at least as large as the microbump height and/or slightly larger to accommodate a margin on either or both sides of a height of the microbump 105. The microbumps 105 in a row 113 may be arranged with upper edges arranged parallel to one another and/or with lower edges arranged parallel to one another, for example.

The rows 113 extend in a left to right direction in FIG. 1, which may correspond to a lateral direction defined by the body 103 (or a direction parallel to the lateral direction). Within an individual row 113, the microbumps 105 can be arranged laterally from one another. Rows 113 may be arranged transversely from one another, such as one above another in a transverse direction or parallel the transverse direction (which may correspond to an up and down direction in the view of FIG. 1). The transverse direction may be perpendicular to the lateral direction, for example.

The rows 113 of microbumps 105 may be arranged in pairs 115 of rows 113. For example in FIG. 1, each pair 115 includes an upper row 113U and a lower row 113L. The upper row 113U and the lower row 113L can be arranged from one another in the transverse direction, for example. The upper row 113U and the lower row 113L can include different sets of microbumps 105, such as respectively a first set and a second set.

Various types of spacing may be implemented between components within a row 113 and/or within a pair 115 of rows 113. For example, adjacent microbumps 105 within a row 113 may be spaced apart by a lateral offset 117. The lateral offset 117 may correspond to the distance between a leading edge of one microbump 105 and a leading edge of a subsequent and adjacent microbump 105. The lateral offset 117 additionally or alternatively may be a center-to-center distance or other suitable relationship between adjacent microbumps 105 within a row 113. In some examples, the lateral offset 117 may correspond to 45 µm, for example (e.g., in conformity with a pitch rule of 45 µm set by a foundry).

Microbumps 105 may be spaced relative to microbumps 105 in another row 113. For example, a microbump 105 in a lower row 113L in a pair 115 may be subject to a radial offset 119 from a microbump 105 in an upper row 113U of the pair 115. The radial offset 119 may be a center-to-center distance or other suitable relationship between radially adjacent microbumps 105. The radial offset may correspond to a distance of 45.0096 µm, for example (e.g., in conformity with a pitch rule of 45 µm set by a foundry).

A microbump 105 in a lower row 113L in a pair 115 may be subject to a transverse offset 120 from an adjacent microbump 105 in an upper row 113U of the pair 115. The transverse offset 120 may be a lower-edge-to-lower-edge distance, a center-to-center distance or other suitable relationship between transversely adjacent microbumps 105. The transverse offset 120 may correspond to a distance of 38.98 µm, for example. Such offset may be permissible in conformity with a pitch rule of 45 µm set by a foundry based on the center-to-center minimum distance being satisfied by the radial offset 119, for example.

Although the microbumps 105 are shown staggered from one another in adjacent rows 113U and 113L, the microbumps 105 may be arranged directly in alignment in the transverse direction or otherwise arranged in an arrangement other than that depicted. In some cases, arranging the microbumps 105 in a staggered arrangement in adjacent rows 113U and 113L can allow the microbumps 105 to be more closely spaced while maintaining compliance with foundry pitch rules than if the microbumps 105 were arranged directly over one another in the transverse direction. For example, if a foundry rule is that a microbump 105 in a lower row 113L must be at least 45 µm in center-to-center distance from a nearest microbump 105 in an adjacent upper row 113U, the staggered arrangement may allow this rule to be satisfied by a radial offset 119 of 45 µm while the transverse offset 120 may be 38.98 µm or other value less than the minimum center-to-center distance set by the foundry.

The probe pad 107 may extend across adjacent rows 113. For example, the probe pad 107 may be arranged to at least partially extend into an upper row 113U of a respective pair 115 and also extend into a lower row 113L of the respective pair 115.

The probe pad 107 extending into multiple rows 113 may correspond to the probe pad 107 being arranged within a space unoccupied by microbumps 105. For example, the probe pad 107 in FIG. 1 may be positioned in a space in which three microbumps 105 may be absent from a repeating pattern in the pair 115 of rows 113. This may be seen in FIG. 1 by comparing a position of a probe pad 107 in one pair 115 of rows 113 with a position that is adjacent transversely (e.g., in the up and down direction in FIG. 1) in an adjacent pair 115 of rows 113 (e.g., where three microbumps 105 may be seen instead of the probe pad 107). Although the probe pad 107 is shown occupying a suitable space for replacing three microbumps 105, the probe pad 107 may be arranged to replace any suitable number of microbumps 105 within a pair 115 of rows 113, including one, two, three, or more than three microbumps 105. Moreover, although some microbumps 105 are accordingly eliminated from the pattern to accommodate space for the probe pad 107, the arrangement that includes the probe pad 107 extending across two rows 113 can allow the rows 113 to be more compact and thus attain a greater density of microbumps 105 in comparison to arrangements in which an individual row 113 is instead sized to individually accommodate the probe pad 107. In one illustrative example, utilizing an array pattern with probe pads 107 that extend across two rows 113 has been found to increase the number of microbumps 105 by 46% and the number of probe pads 107 by 29% within a fixed space compared to an arrangement in which an individual row 113 is instead sized to individually accommodate the probe pad 107.

In FIG. 1, the probe pads 107 within the respective pair 115 of rows 113 are shown with a lateral probe pad offset 121 between probe pads 107 that are next or subsequent to each other in series. The lateral probe pad offset 121 may be a leading-edge-to-leading-edge distance, a center-to-center distance or other suitable relationship between serially subsequent probe pads 107. As an illustrative example, the lateral probe pad offset 121 may correspond to 270 µm or other suitable distance.

Although the probe pads 107 are shown with nine microbumps 105 in between subsequent probe pads 107 in series, any number of microbumps 105 may be arranged between the probe pads 107 in use. For example, the number of microbumps 105 between subsequent probe pads 107 may change an amount of the probe pad offset 121 in operation.

Pairs 115 of rows 113 can be arranged relative to one another. In various arrangements, pairs 115 are arranged in a power rail 123 and a ground rail 125. The power rail 123 and the ground rail 125 be arranged in a pattern that alternates between power rails 123 and ground rails 125, for example. Each power rail 123 may include a respective pair 115 of rows 113, and each ground rail 125 may include another respective pair 115 of rows 113.

Components of the system 101 may be spaced relative to the power rail 123 and/or the ground rail 125. As one example, FIG. 1 shows a power-to-ground offset 127. The power-to-ground offset 127 may correspond to a distance between a center of the power rail 123 and a center of the ground rail 125, although other respective reference points may be utilized in addition or alternatively. In some embodiments, the power-to-ground offset 127 may correspond to a distance between respective reference points of a probe pad 107 in one pair 115 of rows 113 and a probe pad 107 in an adjacent pair 115 of rows 113. The power-to-ground offset 127 may correspond to 77.96 µm, although other distances may be utilized.

In FIG. 1, a power-to-power offset 129 is also shown. The power-to-power offset 129 may correspond to a center-to-center distance or other distance between like reference points within one power rail 123 and another power rail 123. The power-to-power offset 129 may correspond to 155.92 µm or other suitable distance. The power-to-power offset 129 additionally or alternatively may correspond to a distance between respective reference points of probe pads 107 in different pairs 115 of rows 113. The power-to-ground offset 127 and/or the power-to-power offset 129 can be arranged to permit suitable margins or buffers in between the power rail 123 and the ground rail 125 to avoid shorts or other detrimental interaction therebetween.

Figure 2:
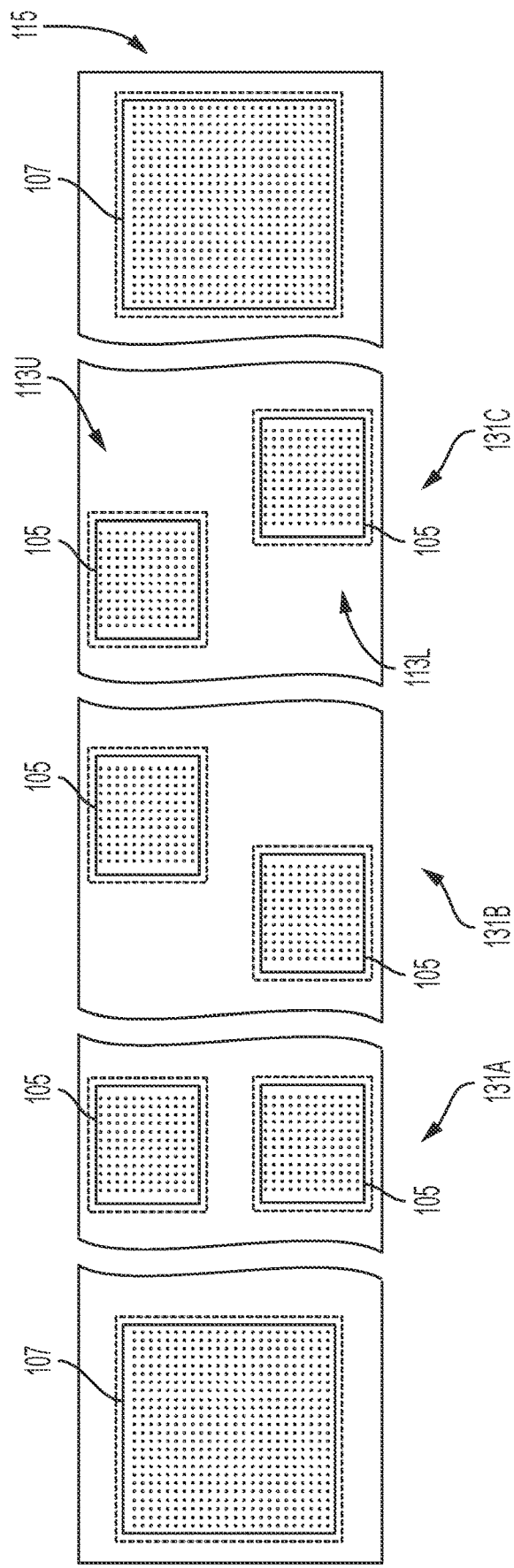
FIG. 2 illustrates different examples of relative arrangements of microbumps that may be implemented between probe pads in accordance with various embodiments.

FIG. 2 depicts an example of a pair 115 of rows 113 with different examples of segments 131 that may be utilized within the pair 115 of rows 113. For example, a first segment 131A is shown in which one microbump 105 is arranged directly above or directly aligned in the transverse direction relative to another microbump 105. A second segment 131B is shown with a microbump 105 in an upper portion of the segment 131 that is laterally staggered forward (e.g., rightward in FIG. 1) of a microbump 105 in a lower portion of the second segment 131B. The third segment 131C shows an upper microbump 105 that is laterally staggered rearwardly (e.g., leftward in FIG. 1) from a microbump 105 in a lower portion of the third segment 131C.

The segments 131A, 131B, and 131C are depicted as separated by break lines. Respective probe pads 107 are also shown present in the pair 115 of rows 113. In use, any given pair 115 of rows 113 may utilize any combination and/or sequence of the segments 131A, 131B, and/or 131C. As illustrative examples, a pair 115 of rows 113 may utilize entirely microbumps 105 that are aligned in a transverse direction (as in segment 131A), may utilize entirely microbumps 105 that exhibit a forward shift in an upper row 113U (as in segment 131B), may utilize entirely microbumps 105 that exhibit a forward shift in a lower row 113L (as in segment 131C), and/or may utilize combinations of arrangements represented in segments 131A, 131B, 131C.

A respective probe pad 107 may be positioned any suitable relative distance to a microbump 105 within the pair 115 of rows 113. For example, with respect to the probe pad 107 at right in FIG. 2, the probe pad 107 may be arranged so that a nearest microbump 105 in a lower row 113L is closer to the probe pad 107 than a nearest microbump 105 in an upper row 113U (such as in segment 131C), or arranged so that a nearest microbump 105 in an upper row 113U is arranged closer to the probe pad 107 than a nearest microbump 105 in a lower row 113L (such as in segment 131B), or arranged to be equally distant in the lateral direction from a nearest microbump 105 in an upper row 113U and nearest microbump 105 in a lower row 113L (such as in segment 131A).

In addition, although three segments 131A, 131B, and 131C are shown in FIG. 2 with a total number of six microbumps 105 in between respective and subsequent probe pads 107 in the series, any number of microbumps 105 may be placed in between subsequent probe pads 107. For example, although six microbumps 105 are shown in FIG. 2, as few as one, two, three, or other minimum number of microbumps 105 may be present in between subsequent probe pads 107. Embodiments additionally or alternatively may include nine, eleven, thirteen, or other numbers of microbumps 105 in between subsequent probe pads 107.

Figure 3:
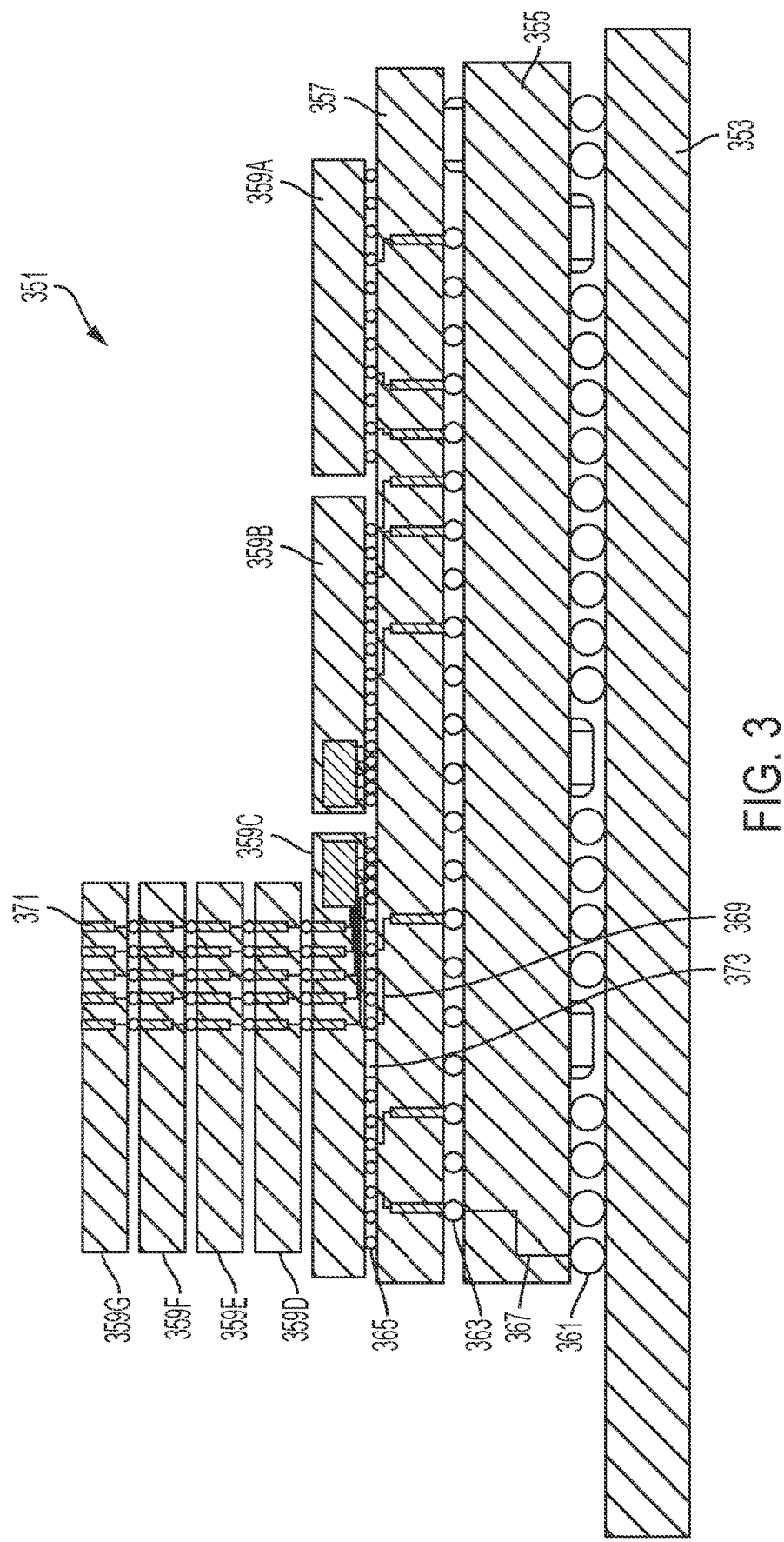
FIG. 3 illustrates an example of a system in which arrays herein may be utilized in accordance with various embodiments.

FIG. 3 illustrates an example of a system 351 in which features of FIG. 1 and/or FIG. 2 may be implemented. The system 351 is depicted with a circuit board 353, a substrate 355, an interposer 357, and various dice 359 (e.g., individually identified as die 359A, die 359B, die 359C, die 359D, die 359E, die 359F, and die 359G), although other combinations of fewer or more different elements may be utilized. The system 351 may correspond to a 2.5D integrated package or 3D integrated package, for example.

The circuit board 353 can correspond to suitable structure for receiving other components. The circuit board 353 may be a motherboard, for example. The circuit board 353 may be a printed circuit board (PCB) in various examples.

The substrate 355 may be the substrate portion of a chip-on-wafer-on-substrate (CoWoS) assembly, for example. The substrate 355 may include silicon, fiberglass, or other suitable organic or non-organic materials. The substrate 355 can include connections sized on a micrometer scale or otherwise suitably sized for connection with the interposer 357.

The interposer 357 may include a suitable body with elements that can allow connection between the substrate 355 and a die or dice 359. The interposer 357 may be the wafer portion of a chip-on-wafer-on-substrate (CoWoS) assembly, for example. The interposer 357 may include silicon, fiberglass, or other suitable organic or non-organic materials. The interposer 357 may include suitable features for spreading a connection from the die 359 to a wider pitch for interoperability with the substrate 355. In some examples, the interposer 357 on an upper or top side or surface includes connections sized on a nano-meter scale for connection with the die 359 and on a lower side or surface (e.g., along an underside) includes connections sized on a micro-meter scale for connection with the substrate 355. The different scales of connections may be coupled by suitable structures extending within the interposer 357, for example.

The die 359 may be the chip portion of a chip-on-wafer-on-substrate (CoWoS) assembly, for example. Any suitable number of dice 359 may be utilized, including one, two, three, or more than three. Any suitable type of dice 359 can be utilized individually or in combination. Examples of suitable types of dice 359 can include any type of integrated circuit, for example, memory dice, compute dice, logic dice, accelerators, and application-specific integrated circuits (ASICs). The die 359 can include connection features at a specific scale suitable for engaging the interposer 357. For example, the die 359 can include connections sized on a nano-meter scale or otherwise suitably sized for connection with the interposer 357. In use, a die 359 may be mounted so that a bottom side of the die 359 is facing a top side of the interposer 357, which may also include an underside with features for engaging the substrate 355. In some embodiments, a respective die 359 may be coupled to another die 359 (such as with dice 359E, 359F, and 359D stacked atop die 359C) for connection to the interposer 357.

Respective elements can include suitable connections at the top, at the bottom, and/or within for establishing connection among elements. In FIG. 3, package balls 361, bump landings 363, microbumps 365, traces 367, short wires 369, vias 371, and probe pads 373 are shown, although other combinations of fewer, more, or different elements may be utilized.

The package balls 361 may be arranged for suitable connection between the circuit board 353 and the substrate 355. The package balls 361 may correspond to a ball grid array (BGA), for example. The package balls 361 may be present on the circuit board 353 and/or on the substrate 355.

The bump landings 363 may be arranged to provide connection between the substrate 355 and the interposer 357. The bump landing 363 may correspond to C4 copper bumps for example. The bump landings 363 may be present on the substrate 355 and/or on the interposer 357.

The microbumps 365 and/or the probe pad 373 can provide connection in between the dice 359 and the interposer 357 (such as with die 359A, 359B and 359C) and/or between respective ones of the dice 359 (such as between 359D, 359E, 359F, and 359G). The microbumps 365 and/or the probe pad 373 may be present on the dice 359 and/or on the interposer 357.

The package balls 361, bump landings 363, microbumps 365, and probe pad 373 are each shown between respective components and may be included on either or both of components along which the interface is formed. For example, microbumps 365 may engage other microbumps and or vias 371 for communication of power and/or signals.

Various components shown or described with respect to FIG. 3 may correspond to other components described herein. For example, the probe pad 373 may be an example of the probe pad 107, the via 371 may be an example of the vias 109, the trace 367 may correspond to the traces 111, and/or the microbumps 365 may correspond to the microbumps 105.

The short wire 369 may provide connection between elements at a same level such as along a top side of the interposer 357. The short wire 369 may contrast with vias 371 and/or traces 367, which may extend through to provide connection along opposite sides of layers and/or components.

Figure 4:
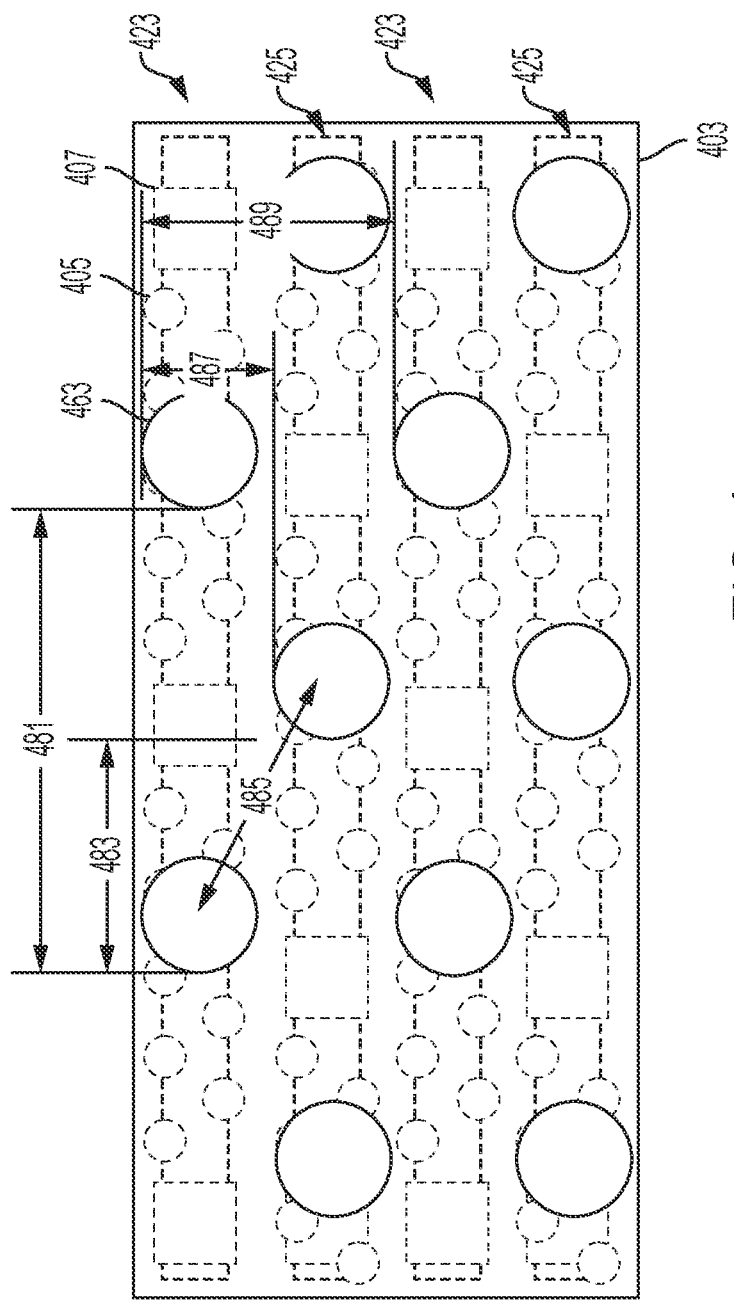
FIG. 4 illustrates an array of bump landings that may be utilized in accordance with various embodiments.

FIG. 4 illustrates an arrangement of further features that may be utilized. In FIG. 4, a body 403 is shown. The body 403 may be an example of the body 103. The body 403 in FIG. 4 is shown with microbumps 405 and probe pads 407, which may correspond to microbumps 105 and probe pads 107 from FIG. 1, for example. In FIG. 4, the body 403 is also shown including a power rail 423 and a ground rail 425, which may correspond to the power rail 123 and ground rail 125 of FIG. 1, for example.

In an illustrative example, the body 403 may correspond to an interposer 357 that has one instance of an array with the microbumps 405 and probe pads 407 arranged for engaging another instance of the array on a corresponding die 359. The microbumps 405 and probe pads 407 may be arranged along a rear side of the body 403 and are accordingly shown in hidden line in FIG. 4.

The body 403 in FIG. 4 is further shown with bump landings 463, e.g., which may correspond to the bump landings 363 of FIG. 3 for example. The bump landings 463 in FIG. 4 may be arranged on an opposite side from other features such as those along the rear side of the body 403. For example, the bump landings 463 may be arranged along a front side of the body 403 and are accordingly shown in solid line.

The landings 463 in FIG. 4 may be arranged so as to be disposed at a position not directly underneath a probe pad 407. Disposing the landings 463 not directly underneath a probe pad 407 can allow for a greater number of landings 463 to be placed relative to a number of probe pads 407, e.g., based on using a different pitch for the landings 463 than for the probe pads 407. For example, pitch limits for the landings 463 may differ from pitch limits for the probe pads 407 and thus may be implemented independently of how many probe pads 407 and microbumps 405 are traded off for density on an opposite side. In one illustrative example, where positioning landings 463 directly opposite probe pads 407 may yield a 29% increase in number of landings 463 within a given space, re-positioning landings 463 to not be directly opposite probe pads 407 may yield a 36% increase in number of landings 463 within the given space.

Elements shown in FIG. 4 may be disposed at suitable distances from one another. In FIG. 4, adjacent or subsequent bump landings 463 within a shared row or rail can be separated by a lateral same-row distance 481. The lateral same-row distance 481 may be 256.30 μm or other suitable distance. This may be a different pitch than the lateral probe pad offset 121, for example.

The bump landings 463 may be spaced apart by a lateral different-row distance 483, which may correspond to a distance between leading edges or other respective reference points of landings 463 in different rails 423 and 425 in FIG. 4. The lateral different-row distance 483 may correspond to 128.15 μm or other suitable distance, for example.

The landings 463 may be separated from one another by a radial distance 485. The radial distance 485 may be a distance between respective reference points of landings 463 in adjacent different rails, for example. The radial distance 485 may be 150.0006 μm or other suitable distance, for example. For example, the spacing along the radial distance 485 may satisfy a minimum distance requirement of 150 μm or other threshold that may be set by foundry rules.

A power-to-ground distance 487 is also shown in FIG. 4. The power to ground distance 487 may correspond to a distance between upper edges or other respective reference points of the landings in a power rail 423 and ground rail 425. The power-to-ground distance 487 may be 77.96 µm, for example. This may be set to be in alignment with the power-to-ground offset 127, which alignment may facilitate a direct connection through vias 371 to a die 359, for example.

A power-to-power distance 489 is also shown in FIG. 4. The power-to-power distance489 can correspond to a distance between respective reference points in power rails 423 that are subsequent to one another in series along the body 403. The power-to-power distance489 may correspond 255.92 µm, for example.

Based on the disclosure and teachings provided herein, a person of ordinary skill in the art will appreciate other ways and/or methods to implement the various embodiments. The specification and drawings are, accordingly, to be regarded in an illustrative rather than a restrictive sense. It will, however, be evident that various modifications and changes may be made thereunto without departing from the broader spirit and scope of the disclosure as set forth in the claims.

Other variations are within the spirit of the present disclosure. Thus, while the disclosed techniques are susceptible to various modifications and alternative constructions, certain illustrated embodiments thereof are shown in the drawings and have been described above in detail. It should be understood, however, that there is no intention to limit the disclosure to the specific form or forms disclosed, but on the contrary, the intention is to cover all modifications, alternative constructions, and equivalents falling within the spirit and scope of the disclosure, as defined in the appended claims.

The use of the terms "a" and "an" and "the" and similar referents in the context of describing the disclosed embodiments (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening. Recitation of ranges of values herein are merely intended to serve as a shorthand method of referring individually to each separate value falling within the range, unless otherwise indicated herein and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate embodiments of the disclosure and does not pose a limitation on the scope of the disclosure unless otherwise claimed. No language in the specification should be construed as indicating any non-claimed element as essential to the practice of the disclosure.

Disjunctive language such as the phrase "at least one of X, Y, or Z," unless specifically stated otherwise, is intended to be understood within the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

Various embodiments of this disclosure are described herein, including the best mode known to the inventors for carrying out the disclosure. Variations of those embodiments may become apparent to those of ordinary skill in the art upon reading the foregoing description. The inventors expect skilled artisans to employ such variations as appropriate and the inventors intend for the disclosure to be practiced otherwise than as specifically described herein. Accordingly, this disclosure includes all modifications and equivalents of the subject matter recited in the claims appended hereto as permitted by applicable law. Moreover, any combination of the above-described elements in all possible variations thereof is encompassed by the disclosure unless otherwise indicated herein or otherwise clearly contradicted by context.

What is claimed is:

1. A semiconductor package, comprising:
   an interposer having a top side;
   a semiconductor die having a bottom side and mounted on the interposer such that the bottom side of the die is facing the top side of the interposer; and
   an interface array positioned on at least one of the top side of the interposer or the bottom side of the die, the interface array defining a lateral direction and a transverse direction that are perpendicular to each other, the interface array comprising:
      a power rail comprising a pair of power rows that includes:
         a first set of power microbumps arranged in a first power row that extends parallel to the lateral direction;
         a second set of power microbumps arranged in a second power row that extends parallel to the lateral direction, wherein the second power row is adjacent to and offset from the first power row in the transverse direction, wherein the first set of power microbumps and the second set of power microbumps are arranged in a repeating power microbump pattern in which the first set of power microbumps and the second set of power microbumps are staggered from one another; and
         a power probe pad that is larger than each of the power microbumps and that is extending into both the first power row and the second power row and located in a space in which no more than three power microbumps are absent from the repeating power microbump pattern; and
      a ground rail comprising a pair of ground rows that includes:
         a first set of ground microbumps arranged in a first ground row;
         a second set of ground microbumps arranged in a second ground row adjacent the first ground row, wherein the first set of ground microbumps and the second set of ground microbumps are arranged in a repeating ground microbump pattern in which the first set of ground microbumps and the second set of ground microbumps are staggered from one another; and
         a ground probe pad extending into both the first ground row and the second ground row and located in a space in which no more than three ground microbumps are absent from the repeating ground microbump pattern.

2. The semiconductor package of claim 1, wherein each of the interposer and the semiconductor die include a separate instance of the interface array.

3. The semiconductor package of claim 1, wherein the interposer further comprises an underside along which are arranged bump landings, wherein each bump landing is offset in the transverse direction and in the lateral direction from a nearest probe pad in the interface array.

4. A semiconductor assembly comprising:
a semiconductor die, comprising:
a body having a top surface and a bottom surface; and
an interface array arranged along the top surface or the bottom surface and comprising:
a power rail comprising a pair of power rows that includes:
a first set of power microbumps arranged in a first power row;
a second set of power microbumps arranged in a second power row adjacent the first power row, wherein the first set of power microbumps and the second set of power microbumps are arranged in a repeating power microbump pattern in which the first set of power microbumps and the second set of power microbumps are staggered from one another; and
a power probe pad extending into both the first power row and the second power row and located in a space in which no more than three power microbumps are absent from the repeating power microbump pattern; and
a ground rail comprising a pair of ground rows that includes:
a first set of ground microbumps arranged in a first ground row;
a second set of ground microbumps arranged in a second ground row adjacent the first ground row, wherein the first set of ground microbumps and the second set of ground microbumps are arranged in a repeating ground microbump pattern in which the first set of ground microbumps and the second set of ground microbumps are staggered from one another; and
a ground probe pad extending into both the first ground row and the second ground row and located in a space in which no more than three ground microbumps are absent from the repeating ground microbump pattern.

5. The semiconductor assembly of claim 4, wherein the interface array defines a lateral direction and a transverse direction that are perpendicular to each other.

6. The semiconductor assembly of claim 5, wherein the first set of power microbumps in the first power row are arranged offset in the lateral direction from one another.

7. The semiconductor assembly of claim 5, wherein the first set of power microbumps in the first power row are arranged offset in the transverse direction from the second set of power microbumps in the second power row.

8. The semiconductor assembly of claim 4, further comprising a via arranged between at least one of the power microbumps of the first power row and another power microbump of the first power row or a power microbump of the second power row.

9. The semiconductor assembly of claim 4, wherein the semiconductor die is included in a semiconductor package that further comprises an interposer to which the die is mounted so that a bottom side of the die is facing a top side of the interposer.

10. A semiconductor assembly comprising:
an interposer, comprising:
a body having a top surface and an underside surface; and
an interface array arranged along the top surface and comprising:
a power rail comprising a pair of power rows that includes:
a first set of power microbumps arranged in a first power row;
a second set of power microbumps arranged in a second power row adjacent the first power row, wherein the first set of power microbumps and the second set of power microbumps are arranged in a repeating power microbump pattern in which the first set of power microbumps and the second set of power microbumps are staggered from one another; and
a power probe pad extending into both the first power row and the second power row and located in a space in which no more than three power microbumps are absent from the repeating power microbump pattern; and
a ground rail comprising a pair of ground rows that includes:
a first set of ground microbumps arranged in a first ground row;
a second set of ground microbumps arranged in a second ground row adjacent the first ground row, wherein the first set of ground microbumps and the second set of ground microbumps are arranged in a repeating ground microbump pattern in which the first set of ground microbumps and the second set of ground microbumps are staggered from one another; and
a ground probe pad extending into both the first ground row and the second ground row and located in a space in which no more than three ground microbumps are absent from the repeating ground microbump pattern.

11. The semiconductor assembly of claim 10, further comprising a set of bump landings arranged along the underside surface of the interposer.

12. The semiconductor assembly of claim 11, wherein each bump landing in the set of bump landings is transversely and laterally offset from a nearest probe pad in the interface array.

13. The semiconductor assembly of claim 10, wherein the power probe pad is a first power probe pad, wherein the interposer further comprises a second power probe pad separated from the first power probe pad by at least one power microbump in the first power row and at least one power microbump in the second power row.

14. The semiconductor assembly of claim 10, wherein a center of a power microbump in the first power row is offset laterally and transversely from a center of a nearest power microbump in the second power row.

15. The semiconductor assembly of claim 10, wherein the first power row and the second power row are arranged adjacent each other along a transverse direction, wherein the first power row, the second power row, and the power probe pad each have a height along the transverse direction, and wherein the height of the power probe pad is larger than the height of the first power row and larger than the height of the second power row.

16. The semiconductor assembly of claim 10, wherein the interposer is included in a semiconductor package that further comprises a semiconductor die mounted on the interposer so that a bottom side of the die is facing the top surface of the interposer.

\* \* \* \* \*